United States Patent
Kubota

[11] Patent Number: 6,154,153
[45] Date of Patent: Nov. 28, 2000

[54] METHOD FOR COMPRESSING AND DECOMPRESSING INTEGER-VECTOR DATA

[75] Inventor: Rie Kubota, Yokohama, Japan

[73] Assignee: International Business Machines Corporation, Armonk, N.Y.

[21] Appl. No.: 08/972,124

[22] Filed: Nov. 17, 1997

Related U.S. Application Data

[63] Continuation of application No. 08/683,879, Jul. 19, 1996, abandoned.

[30] Foreign Application Priority Data

Jul. 19, 1995 [JP] Japan ................................ 7-182462

[51] Int. Cl.[7] ....................................................... H03M 7/30
[52] U.S. Cl. ................................................................. 341/50
[58] Field of Search ........................................ 341/50, 87

[56] References Cited

U.S. PATENT DOCUMENTS 5,586,222 12/1996 Zhang et al. ............................. 395/22

Primary Examiner—Howard L. Williams
Attorney, Agent, or Firm—Ronald L. Drumheller

[57] ABSTRACT

A method for compressing and decompressing integer-vector data by which N-dimensional integer vectors are compressed efficiently and by which a vector that satisfies a specific condition can be quickly decompressed and extracted. The method for compressing integer-vector data, which are represented as an N-dimensional integer vector set T, into an N-dimensional integer vector set T', comprises the steps of: converging a distribution of an i-th component (i is a component number selected from a range wherein i<N) of each vector that belongs to the set T by using a transformation function; and adding information concerning the i-th component to a j-th component (j is a component number selected from a range wherein j>i) in consonance with convergence.

9 Claims, 3 Drawing Sheets

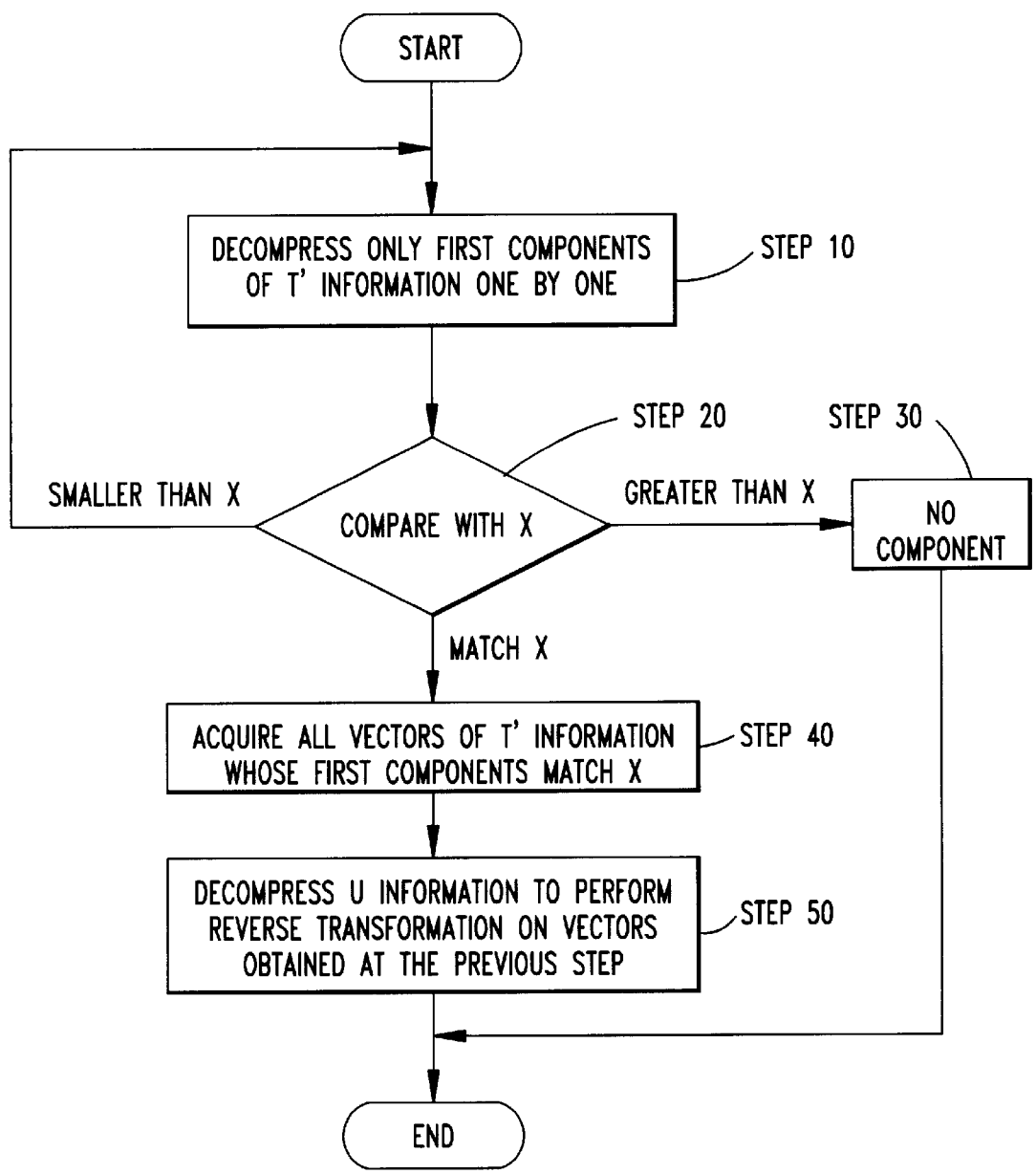

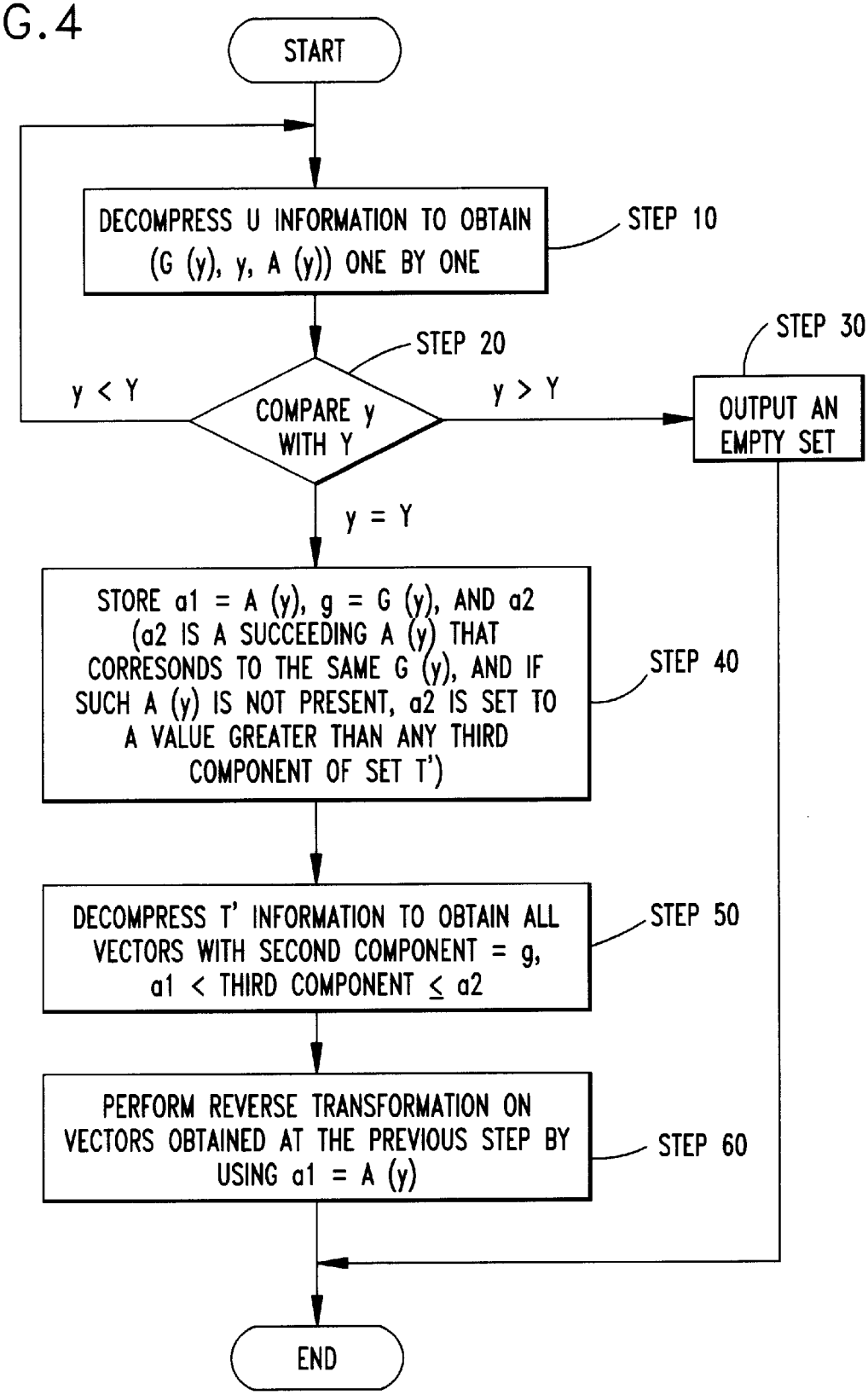

METHOD FOR COMPRESSING AND DECOMPRESSING INTEGER-VECTOR DATA

This is a continuation of application Ser. No. 08/683,879, filed Jul. 19, 1996 now abandoned.

BACKGROUND OF THE INVENTION

1. Field of the Invention

The present invention relates to a method, for compressing and decompressing integer-vector data, by which a large volume of numerically expressed information can be compressed and decompressed.

2. Related Art

To perform high speed processing with a computer, a process is performed whereby a large volume of information is accumulated as a so-called database in a memory area. The information types that are to be stored vary, and it is sometimes convenient for the various types of information to be represented as integer vectors.

As one example, to accumulate the results of questionnaires concerning leisure experiences, appropriate integers are assigned to N items for respondents, trips and sports, impressions of plays, places (country names) and the times at which the plays were watched, etc., and these integers are combined to represent the information as N-dimensional integer vectors.

As another example, when index information is to be provided at the end of an electronic book, N items, such as a header, a page number of a page on which a header appears, a line number, etc., may be stored. For this, headers can be conveniently represented by N-dimensional integer vectors by assigning appropriate integer to each header.

All the relationships among multiple items can very naturally be described by integer vectors as long as the individual item can be identified by integer values that are assigned to them.

Well known methods for storing N-dimensional integer vectors in the memory area of the computer are as follows.

First, a method, which shall be called background 1, will be explained by which integer vectors are rearranged in an ascending order in which priority is given to components with smaller numbers, and by which all the components of all the vectors are then rearranged in order. An example below shows a set T of three-dimensional integer vectors that are rearranged in ascending order:

T={(1, 1, 3), (1, 1, 5), (1, 1, 6), (1, 2, 1), (1, 2, 2), (1, 3, 2), (1, 3, 3), (2, 2, 1), (2, 2, 2)}.

This set is stored in the memory area of the computer as follows:

1, 1, 3, 1, 1, 5, 1, 1, 6, 1, 2, 1, 1, 2, 2, 1, 3, 2, 1, 3, 3, 2, 2, 1, 2, 2, 2.

In this example, a total of 27 integers are stored.

Although this method has an advantage in that the handling is easy, (dimensional number N×vector count) integers must be stored in the memory area. When a large volume of data is to be employed, the number of vectors to be processed increases and occupies the large memory area. This method, therefore, presents a processing difficulty.

A method, which will be called background 2, will now be explained by which integer vectors are rearranged in an ascending order in which priority is given to components with smaller numbers, and by which all the vectors are then rearranged in a tree structure. As an example, the set T of three dimensional integer vectors introduced above is shown below:

T={(1, 1, 3), (1, 1, 5), (1, 1, 6), (1, 2, 1), (1, 2, 2), (1, 3, 2), (1, 3, 3), (2, 2, 1), (2, 2, 2)}.

This set T is stored in the memory area of the computer in the following tree structure.

| first component: | 1 X | | 2 X | |
|---|---|---|---|---|
| | ↓ | | ↓ | |
| second component: | 1 Y | 2 Y | 3 Y | 2 Y |
| | ↓ | ↓ | ↓ | ↓ |
| third component: | 3 5 6 | 1 2 | 2 3 | 1 2 | wherein X is information that indicates the beginning of corresponding second component information; and Y is information that indicates the beginning of corresponding third component information. The sum of the components and X and Y information items is 21, and the volume of data to be stored is reduced compared with that stored by the background 1 method.

3. Objective

Actually, however, when the number of data to be stored becomes great by increasing the number N of the components of the N-dimensional integer vectors, or by increasing the number of the vectors in a set, a large memory area must be acquired even in the above described background 2 method.

Therefore, more efficient data compression method than those of the backgrounds is required. In addition, fast, efficient decompression method for a large volume of compressed data is also required. When the results of questionnaires concerning leisure experiences are accumulated as mentioned above, only the accumulated information that satisfies specific conditions tends to be referred to; for example, only information concerning places (country names) may be referred to. It is therefore preferable that only the compressed data that is necessary be decompressed, rather than all of the compressed data being decompressed, so that the required data can be obtained within a short time.

It is therefore one objective of the present invention to provide a method for compressing and decompressing integer vector data, by which N-dimensional integer vectors are compressed efficiently, and to ensure that only those vectors that satisfy specific conditions will be quickly decompressed and extracted.

SUMMARY OF THE INVENTION

To achieve the above objective, according to the present invention, a method for compressing integer-vector data, which are represented as an N-dimensional integer vector set T into an N-dimensional integer vector set T', comprises the steps of: converging a distribution of an i-th component value (i is a component number selected from a range wherein i<N) of each vector that belongs to the set T by using a transformation function; and adding information concerning the i-th component to a j-th component (j is a component number selected from a range wherein j>i) in consonance with convergence.

Further, to achieve the objective, a method for compressing integer-vector data, which are represented as an N-dimensional vector set T into an N-dimensional integer vector set T', comprises the steps of: defining a transformation function that satisfies these conditions: (1) all i-th component values (i is a component number selected from a range wherein i<N) of vectors that belong to the set T are included in a domain of the transformation function, (2) the transformation function provides a many-to-one mapping, and (3) the transformation function is an increasing function;

converging a distribution of the i-th component values of the vectors that belong to the set T by using the transformation function; and adding information concerning the i-th components to j-th components (j is a component number selected from a range wherein j>i) in consonance with convergence.

In addition, to achieve the above objective, according to the present invention, a method for compressing integer-vector data that are represented as an N-dimensional integer vector set T into an N-dimensional integer vector set T' comprises the steps of:

defining transformation function G that satisfies these conditions: (1) all i-th component values (i is a component number selected from a range wherein i<N) of vectors that belong to the set T are included in a domain of the transformation function, (2) the transformation function provides a many-to-one mapping, and (3) the transformation function is an increasing function;

selecting component number j from a range wherein j>i, while a k-th smallest value of i-th component values, excluding overlapping values, is defined as [k];

defining transformation function A that satisfies a condition such that when G([k+1])=G([k]), $$A([k+1])+\min(v_j | v \in T, v_i=[k+1]) > A([k])+\max(v_j | v \in T, v_i=[k]);$$

performing a transformation by the transformation function G so as to converge a distribution of the i-th component values of vectors that belong to the set T; and adding, to j-th component values of the vectors that belong to the set T, values that are acquired by applying the corresponding transformation function A to the i-th components.

Further, to achieve the above objective, according to one of the above described methods for compressing integer-vector data, the components of the vectors of the N-dimensional integer vector set T' are arranged in an ascending order in which priority is given to components having smaller numbers, and the set T' is located in the memory area of the computer in a partially decompressible format.

Moreover, to achieve the above objective, a method for decompressing integer-vector data that are compressed by the above method for compressing the data, comprises the steps of:

combining an i-th component $v_i$, transformation function $G(v_i)$, and function $A(v_i)$ for each vector of the set T during compression of integer-vector data in a form of a three-dimensional vector $(G(v_i), v_i, A(v_i))$;

forming a three-dimensional vector set U from which overlapping is removed; and reproducing an N-dimensional integer vector set T by performing a reverse transformation of an N-dimensional integer vector set T' with the three-dimensional vector set U.

According to the present invention, provided is a method by which a set of specific dimensional integer vectors is so compressed that a partial decompression can be performed while the compressed data are located in the memory area of the computer. An N-dimensional vector is a group of N integers $(x_1, x_2, \ldots, x_n)$. A transformation function is employed to enable a greater convergence of a distribution of i-th component values of the N-dimensional integer vector set, which is to be processed, and to enable the performance of reverse transformation. Since the transformed vector set and a vector set that is newly prepared to save information concerning reverse transformation are regarded as the targets to be directly compressed, compression can be so performed that the number of integers to be arranged can be considerably reduced.

In addition, since the components to be directly compressed are positioned in an ascending order, adequate compression means that uses such a component arrangement can be employed for data compression. As a partial data decompression is possible, when data are to be referred to in order to acquire a vector that satisfies a predetermined condition, decompression of only the data that are required can be performed and the decompression of all the data is not necessary, and thus fast decompression and quick availability for reference is possible.

BRIEF DESCRIPTION OF THE DRAWINGS

FIG. 3 is a flowchart showing decompression procedures for another embodiment of the present invention.

FIG. 4 is a flowchart showing decompression procedures for the embodiment of the present invention.

DESCRIPTION OF THE PREFERRED EMBODIMENT

Compression and decompression methods for integer-vector data according to one embodiment of the present invention will now be described while referring to FIGS. 1 through 4.

Figure 1:
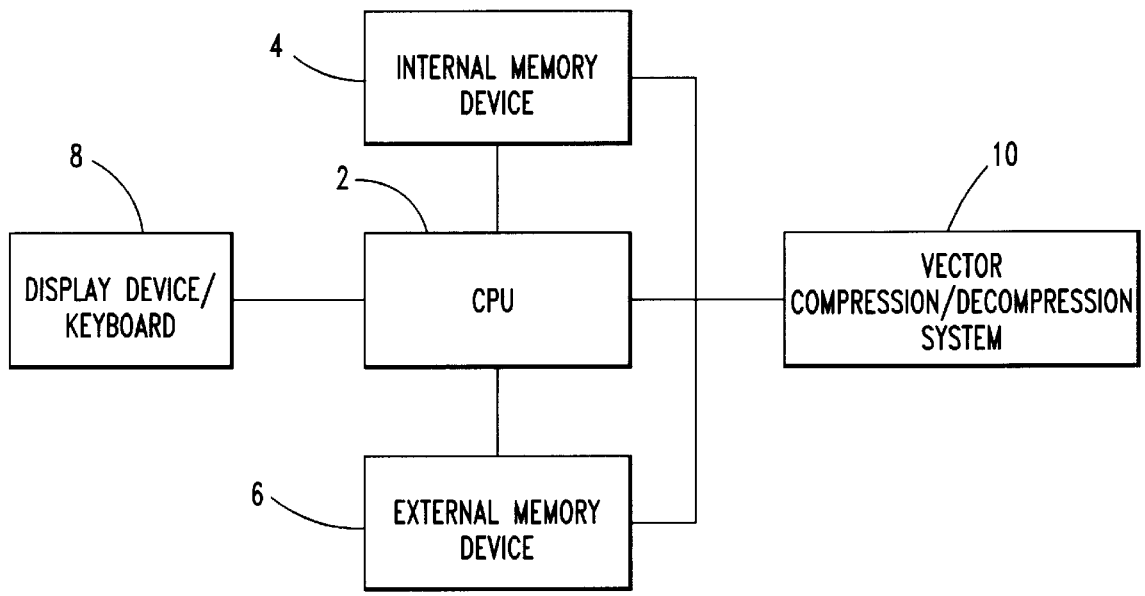
FIG. 1 is a diagram showing an example system configuration according to the present invention.

An example system configuration that is employed in the embodiment of the present invention is shown in FIG. 1. An internal memory device 4 and an external memory device 6 are connected to a central processing unit (CPU) 2, and a vector compression and decompression system 10, which in the embodiment employs a compression and decompression method for integer-vector data, is stored in the external memory device 6. The vector compression and decompression system 10 is loaded in the internal memory device 4 when data compression/decompression is to be performed, and is employed by the CPU 2. A display device/keyboard 8 is connected to the CPU 2 for necessary manipulation and data input.

Figure 2:
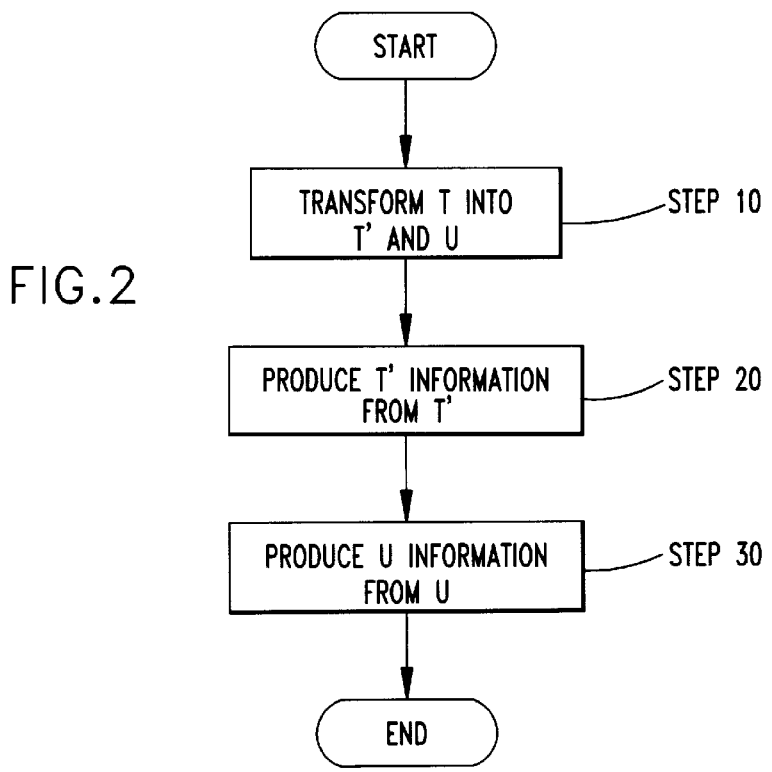
FIG. 2 is a flowchart showing compression procedures for one embodiment of the present invention.

A method for compressing integer vector data according to the embodiment of the present invention will now be described while referring to FIG. 2. FIG. 2 is a flowchart for explaining briefly the method according to the present invention for compressing integer-vector data.

First, all the vectors that belong to an N-dimensional integer vector set T are transformed by transformation functions G and A, which are defined in advance, and a vector set T' is acquired wherein a distribution of values of the i-th component values (i is a component number selected from the range wherein i<N) is more convergent. At this time, a three-dimensional vector set U is defined, which will later be employed for a data decompression process. The set U is acquired at the same time that the set T' is obtained (step 10).

Then, the vectors of the set T', which are obtained as a result of the transformation, are rearranged in an ascending order in which priority is given to components with smaller numbers. The rearranged vectors are then compressed by an ordinary compression means that utilizes such a vector arrangement, and "T' information" is thereby acquired (step 20).

The vectors of the set U are rearranged in an ascending order in which priority is given to components with smaller numbers. The rearranged vectors are compressed by an ordinary compression means that utilizes such a vector arrangement, and "U information" is thereby acquired (step 30).

More specific procedures for the above steps will now be described.

At step 10, to transform the N-dimensional integer vector set T into the N-dimensional integer vector set T', first, transformation function G is defined, with which a distribution of the i-th component values (i is a component number selected from the range wherein i<N) of the set T is converged, i.e., the value count of the i-th component values are reduced.

Thus, a function that satisfies the following three conditions is defined as the transformation function G(x) that is applied to the i-th component:

(1) all the i-th component values of the set T are included in a defined domain.

(2) the function provides a many-to-one mapping.

(3) the function is an increasing function (as x is increased, G(x) is also increased).

One example of G(x) is:

$$G(x) = \text{element count} (\{v | v \in T, v_i < x\})/K \quad (1).$$

Considering the fact that the vector set is divided by a value that is acquired by performing the transformation function G on the i-th component, according to expression (1), the number of elements of each of the divided sets is approximately K, which means almost equal division is performed. It should be noted that K is a sufficiently great constant.

Another example of G(x) is:

$$G(x) = x/L \quad (1')$$

wherein L denotes a sufficiently great constant and G(x) denotes only a quotient.

Function A is defined in a domain with all the i-th component values and is employed to add the information concerning the i-th components of the vectors of the set T to the j-th components (j is a component number adequately selected from the range wherein j>i).

The k-th smallest number of all the i-th component values, excluding overlapping, is represented as [k]. The function A is so defined that it satisfies the following:
when G([k+1])=G([k]), $$A([k+1]) + \min(v_j | v \in T, v_i = [k+1]) > A([k]) + \max(v_j | v \in T, v_i = [k]).$$

When all the j-th component values are positive, an inductive definition example for the function A is as shown below:

$$A([1]) = 0$$

If $G([k+1]) \neq G([k])$, $$A([k+1]) = 0$$

If $G([k+1]) = G([k])$, $$A([k+1]) = A([k]) + \max(v_j | v \in T, v_i = [k]) \quad (2).$$

All the vectors in the set T are transformed by using functions G and A in accordance with expression (3) below. That is, the function G is performed on the i-th component values, while the result obtained by performing the function A on the i-th component value is added to the j-th component of each vector.

$$F(v) = (v_1, \ldots, v_{i-1}, G(v_i), \ldots, v_j + A(v_i), v_{j+1}, \ldots, v_N) \quad (3).$$

The transformation by the expression (3) means that the set T is transformed so that all the vectors yield the following results:

the i-th component: $v_i \rightarrow G(v_i)$ the j-th component: $v_j \rightarrow v_j + A(v_i)$ the other components: no change.

The resultant vector set is defined as T'.

Further, a new three-dimensional vector set U is acquired that is employed for reverse transformation from the set T' to the set T.

The i-th component values of all the vectors before transformation, i.e., the i-th component values $v_i$ of the vectors that belong to the set T, the transformation function $G(v_i)$, and the function $A(v_i)$ are combined to provide $(G(v_i), v_i, A(v_i))$, and a set from which an overlapping portion is removed is defined as the three-dimensional vector set U.

The above process corresponds to step 10 in the flowchart in FIG. 2. The following is an example where the sets T' and U are produced from the three-dimensional vector set T that consists of 20 elements with i=2 and j=3.

T={(1, 2, 4), (1, 2, 7), (1, 3, 2), (1, 4, 1), (1, 5, 3), (1, 5, 4), (2, 2, 2), (2, 3, 1), (2, 4, 3), (2, 4, 4), (2, 5, 1), (3, 2, 6), (3, 3, 4), (3, 4, 2), (4, 2, 1), (4, 2, 3), (4, 2, 5), (4, 3, 3), (4, 4, 5), (4, 5, 2)}

When $G(x) = x/10$, $$G(2) = G(3) = G(4) = G(5) = 0$$

$$A([1]) = A(2) = 0$$

$$A([2]) = A(3)$$

$$= A(2) + \max(\text{third component} | (1, 2, 4),$$
$$(1, 2, 7),$$
$$(2, 2, 2),$$
$$(3, 2, 6),$$
$$(4, 2, 1),$$
$$(4, 2, 3),$$
$$(4, 2, 5))$$

$$= 0 + 7 = 7$$

$$A([3]) = A(4)$$

$$= A(3) + 4 = 11$$

$$A([4]) = A(5)$$

$$= A(4) + 5 = 16$$

The first vector (1, 2, 4) in the set T is transformed as shown below by expression (3):

$$\overset{T}{(1, 2, 4)} \rightarrow \overset{T'}{(1, G(2), 4 + A(2))} = (1, 0, 4).$$

In the same manner, the succeeding vectors in the set T are transformed into vectors in the set T' as is subsequently shown.

The vector of the three-dimensional vector set U that corresponds to the second component value "2" is obtained by definition as below:

$$(G(2), 2, A(2)) = (0, 2, 0).$$

In the same manner, the vectors that correspond to all the second component values are acquired to provide the following three-dimensional vector set U.

| T | T' | U |
|---|---|---|
| (1, 2, 4) | (1, 0, 4) | (0, 2, 0) |
| (1, 2, 7) | (1, 0, 7) | (0, 3, 7) |
| (1, 3, 2) | (1, 0, 9) | (0, 4, 11) |
| (1, 4, 1) | (1, 0, 12) | (0, 5, 16) |
| (1, 5, 3) | (1, 0, 19) | |
| (1, 5, 4) | (1, 0, 20) | |
| (2, 2, 2) | (2, 0, 2) | |
| (2, 3, 1) | (2, 0, 8) | |
| (2, 4, 3) | (2, 0, 14) | |
| (2, 4, 4) | (2, 0, 15) | |
| (2, 5, 1) | (2, 0, 17) | |
| (3, 2, 6) | (3, 0, 6) | |
| (3, 3, 4) | (3, 0, 11) | |
| (3, 4, 2) | (3, 0, 13) | |
| (4, 2, 1) | (4, 0, 1) | |
| (4, 2, 3) | (4, 0, 3) | |
| (4, 2, 5) | (4, 0, 5) | |
| (4, 3, 3) | (4, 0, 10) | |
| (4, 4, 5) | (4, 0, 16) | |
| (4, 5, 2) | (4, 0, 18) | |

The process at step 20 in FIG. 2 will now be explained in detail by employing the above example.

The vectors of the set T' are rearranged in an ascending order in which priority is given to smaller component numbers. Then, components are arranged in the order beginning from the first component and continuing up to the N-th component, with the first through the (N−1)-th components being arranged only when they are changed. More specifically,

```
first          second         third
component      component      component
↓              ↓              ↓
1    X         0    Y         4   7   9   12  19  20
first          second         third
component      component      component
↓              ↓              ↓
2    X         0    Y         2   8   14  15  17
first          second         third
component      component      component
↓              ↓              ↓
3    X         0    Y         6   11  13
first          second         third
component      component      component
↓              ↓              ↓
4    X         0    Y         1   3   5   10  16  18
``` wherein X is a value indicating a jump to the next first component, and Y is a value indicating a jump to the next second component.

With this arrangement, 36 integers are positioned in the memory area. Since each component is arranged in the ascending order within a range until a component that has a smaller number appears, a compression method that utilizes the arrangement in ascending order should be employed for each range. A specific example method is to calculate a difference between a current number and a preceding number and to code the difference. The integers may be sequentially arranged according to the components that are to be positioned in a memory area as in a tree structure that is shown below.

```
first component:    1 X                          2 X
                    ↓                            ↓
second component:   0 Y                          0 Y
                    ↓                            ↓
third component:    4  7  9  12  19  20  2  8  14  15  17
first component:    3 X                          4 X
                    ↓                            ↓
second component:   0 Y                          0 Y
                    ↓                            ↓
third component:    6  11  13  1  3  5  10  16  18
```

It should be noted that X is information (a value) that indicates the beginning of corresponding second component information, and Y is information (a value) that indicates the beginning of corresponding third component information.

Either one of the above two positioning methods may be employed, or a combination of the two methods may be employed. In either case, the number of integers to be located is unchanged. If partial compression that utilizes the ascending order is not performed and the integers are sequentially arranged according to the components, a binary search can be applied. Particularly when the first component is positioned without partial compression that utilizes the ascending order, it can be referred to at high speed.

The set T' with its contents appropriately positioned and optionally compressed in the above described manner is termed "T' information".

Step 30 in FIG. 2 will now be described by using the above described example.

The elements of the three-dimensional vector set U, which constitutes information for reverse transformation, are rearranged in an ascending order in which priority is given to smaller number components, and then the first component ($G(v_i)$), the second component ($v_i$) and the third component ($A(v_i)$) are positioned in the named order. The first component is positioned only when the current value is different from the previous one. Then three components of a vector in the set U are arranged as follows:

```
While U = {(0, 2, 0) , (0, 3, 7) , (0, 4, 11) , (0, 5, 16)},
G         A         A         A         A
↓         ↓         ↓         ↓         ↓
0    X    2    0    3    7    4    11   5    16
          ↑         ↑         ↑         ↑
          v_i       v_i       v_i       v_i
```

X is a value showing information to jump to the next $G(v_i)$. In this manner, ten integers are positioned, as three-dimensional vector set U for reverse transformation, in the memory area. While the first components are arranged totally in an ascending order, the second and the third components are arranged in an ascending order within a range until the succeeding first component appears. Therefore, a compression method that utilizes the arrangement in an ascending order should be employed for each range. The components can be arranged totally or partially in a tree structure, as well as the above described case, and by employing either method, the number of integers that are to be positioned is unchanged.

The set U with its content appropriately positioned and optionally compressed is termed "U information".

The compression method for integer-vector data according to the present invention has been described.

Now, to refer to the data that are acquired by the above compression method, the method, according to the present invention, for decompressing integer-vector data will be explained by which only a vector that satisfies a specific condition is selected and referred to at high speed. Since a method for decompressing all the compressed data is obvious by referring to the above described compression method, a reference method for acquiring a vector that satisfies a specific condition will be described by employing an example.

With the set T being a three-dimensional integer vector set and the transformation function G being defined for the second component, i.e., when i=2 and j=3, a decompression method for acquiring all three-dimensional vectors whose first components are X will be explained as a first decompression example. The flowchart for the first decompression example is shown in FIG. 3.

First, only the first components of the T' information are decompressed, one by one (step 10). A resultant component value is compared with a first component value X (step 20). When the decompressed first component value is smaller than X, program control returns to step 10 whereat a succeeding first component is decompressed. If all the first component values are greater than X, i.e., when no value matches X, it is assumed that the result of decompression is an empty set, and the process is thereafter terminated (step 30). More specifically, when the first components are decompressed in order and all have a value that is greater than X, the decompression process is halted.

When a first component value matches X, second and third components that correspond to the first component are decompressed. The T' information is partially decompressed in this manner, and all the three-dimensional vectors whose first components are X are acquired (step 40).

As a result, a three-dimensional vector of the set T' that corresponds to the target three-dimensional vector (X, y, z) is acquired below:

$$(x', y', z')=F(X, y, z)=(X, G(y), z+A(y)).$$

Only a portion that concerns a vector whose first component is X is decompressed and referred to, that is, partial decompression and high speed reference of data are accomplished.

Then, the U information is decompressed to perform reverse transformation for the resultant vector that is obtained above (step 50). More specifically, only G(y) of each resultant vector (x', y', z') is decompressed until G(y) matches y'. Then, y and A(y) that correspond to the matched G(y) are decompressed, so that the maximum A(y) which is less than z', and its corresponding y are acquired. Based on these values, reverse transformation of expression (3) is performed to reproduce the original vector, which is then output.

An example method for decompressing the three-dimensional vectors acquired by the previously described compression method in order to acquire all the vectors whose first component values are 2 is described below.

First, the first components in the T' information are sequentially decompressed to acquire vectors whose first components are 2. When such a component is acquired, corresponding second and third components are also decompressed to provide the following vectors that belong to the set T':

(2, 0, 2), (2, 0, 8), (2, 0, 14), (2, 0, 15), (2, 0, 17).

Following this, the U information is decompressed and reverse transformation is performed on the set T' to reproduce vectors that belong to the set T. The results are shown below.

| t' (x', y', z') | U for decompression (y', y, A(y)) → | reproduced T (x, y, z'-A(y)) |
|---|---|---|
| (2, 0, 2) | (0, 2, 0) | (2, 2, 2- 0) = (2, 2, 2) |
| (2, 0, 8) | (0, 3, 7) | (2, 3, 8- 7) = (2, 3, 1) |
| (2, 0, 14) | (0, 4, 11) | (2, 4, 14-11) = (2, 4, 3) |
| (2, 0, 15) | (0, 4, 11) | (2, 4, 15-11) = (2, 4, 4) |
| (2, 0, 17) | (0, 5, 16) | (2, 5, 17-16) = (2, 5, 1) |

A second decompression example will now be explained while referring to FIG. 4. The second example decompression method is employed to acquire all the vectors whose second components are Y when the set T is the three-dimensional vector set and the transformation function G is defined for the second component, i.e., when i=2 and j=3.

The U information is decompressed sequentially from the beginning to acquire values G(y), y and A(y) in order (step 10). When the value y exceeds Y, the decompression of the U information is halted (step 20).

When y does not match Y, the result of the decompression is an empty set and the process is thereafter terminated (step 30).

When y matches Y, corresponding G(y) and A(y) values are defined as g and $a_1$, respectively, and the succeeding A(y) that corresponds to G(y) is defined as $a_2$. When there is no succeeding A(y) that corresponds to G(y), a value that is greater than any third component value in the set T' is stored as $a_2$ (step 40).

Then, the T' information is decompressed to obtain all the vectors wherein the second component value=g and $a_1$<the third component value≦$a_2$ (step 50).

More specifically, for all the first components of the set T', only the second components of the set T' are sequentially decompressed until the second component is obtained that matches g. If there is no second component that matches g, the following process related to the first components is begun.

When the second component that matches g is found, a corresponding third component is decompressed and only a vector with $a_1$<the third component<$a_2$ is stored. As for vectors whose second components do not match g, their third components are not decompressed, i.e., partial decompression is performed.

By employing $a_1$ as A(y), reverse transformation is performed on the vectors that are obtained for the set T' to recover the original vectors, which are output (step 60).

A decompression example method that will now be described acquires vectors whose second components are 3 by using the three-dimensional vectors that are obtained by the above compression method.

First, vector (0, 3, 7), whose second component is 3, is obtained by referring to the U information. g=0, $a_1$=7 and $a_2$=11.

Second, the T' information is decompressed to acquire the following vectors with the second component=0 and 7<the third component<11:

(1, 0, 9), (2, 0, 8), (3, 0, 11), (4, 0, 10).

The vector (0, 3, 7), which was obtained from the U information, is employed to recover vectors as follows:

$$(1, 0, 9) \rightarrow (1, 3, 9-7) = (1, 3, 2)$$
$$(2, 0, 8) \rightarrow (2, 3, 8-7) = (2, 3, 1)$$
$$(3, 0, 11) \rightarrow (3, 3, 11-7) = (3, 3, 4)$$
$$(4, 0, 10) \rightarrow (4, 3, 10-7) = (4, 3, 3).$$

According to the compression and decompression methods in this embodiment, a specific dimensional integer vector set can be optimized for compression and decompression and only a data portion that is required will be decompressed, which enables fast processing.

The present invention is not limited to the above described embodiment, but can be variously modified.

To simplify the description, in the above embodiment one of the components, i.e., the i-th component, is selected as means for converging the distribution of values. However, a plurality of components may be selected. In this case, components for which a value distribution should be converged, and components to which information concerning the former components is to be added are so selected that they do not overlap, and reverse transformation vector set U need only to be prepared for each of these two types of components.

Although, in the above embodiment, it is premised that all the components of vectors to be compressed are positive values, the present invention can also be applied to vectors whose components comprise 0 or negative values by appropriately defining the function A.

In the above embodiment, transformation function G of two types is employed, but functions are not limited to those so long as they satisfy the three conditions that together define the transformation function G. And as a value range is so determined that it is as small a set as possible, the compression rate can be increased.

The present invention can be widely employed for accumulating the relationships between items in such a form that can be processed by a computer.

(1) Compression effect due to the reduction in the number of integers to be located.

For an N-dimensional integer vector set T, the numbers S1(T) and S2(T) of the integers that are positioned in the background 1 and 2, and the number S(T) of integers that are positioned by the compression method of the present invention are represented by expressions (4), (5) and (6), respectively. #m__n(T) denotes the number of integers after the combination of the m-th component through the n-th component of each vector in the set T has been extracted and an overlapping portion has been removed.

The number of integers that are positioned in the background 1 is $$S1(T) = \#1\_N(T) \times N \quad (4)$$

while the number of integers that are positioned in the background 2 is $$S2(T) = \sum_{k=1}^{N-1} \#1\_k(T) \times 2 + \#1\_N(T). \quad (5)$$

The number of integers that are positioned by the method of the present invention is $$S(T) = S2(T') + \text{integer count of U information}$$

which is $$S(T) = \sum_{k=1}^{N-1} \#1\_k(T') \times 2 + \#1\_N(T') + (\#i\_i(T) + \#i\_i(T')) \times 2. \quad (6)$$

For the 20 three-dimensional vectors that are used in the compression example method, the effect obtained with the present invention is shown below, where the values of the vector set T that are to be compressed are $$N=3$$

$$\#1\_1(T)=4$$

$$\#1\_2(T)=15$$

$$\#1\_3(T)=20.$$

Therefore, according to expression (4), the number of the integers that are positioned with the background 1 is $$S1(T)=\#1\_3(T)\times N=20\times 3=60.$$

Further, according to expression (5), the number of the integers that are positioned with the background 2 is $$S2(T)=(\#1\_1(T)+\#1\_2(T))\times 2+\#1\_3(T)=(4+15)\times 2+20=58.$$

Since the values of the transformed T' are $$\#1\_1(T')=\#1\_1(T)=4$$

$$\#1\_2(T')=4$$

$$\#1\_3(T')=\#1\_3(T)=20$$

$$\#2\_2(T')=4,$$

according to expression (6), the number of integers that are positioned with this invention is $$S(T)=(\#1\_1(T')+\#1\_2(T'))\times 2+\#1\_3(T')+(\#2\_2(T)+\#2\_2(T'))\times 2= (4+4)\times 2+20+(4+1)\times 2=46.$$

It is apparent that, by using the compression method of the present invention as in this example, the number of integers to be located is reduced to 46/60=76.7% of the integer count for the background 1 and to 46/58=79.3% of the integer count for the background 2.

The present invention provides the compression effect by preparing a vector set T' such that #1__m (i≦m<j) is considerably reduced while #1__n (n<i, n≧j) is unchanged. Expression (7) shows how many integers to be positioned can be reduced with this invention compared with the background 2, since $$S2(T)-S(T)=S2(T)-S2(T')-\text{integer count of U information}$$

which is $$S2(T) - S(T) = \sum_{m=1}^{j-1} (\#1\_m(T) - \#1\_m(T')) - (\#i\_i(T) - \#i\_i(T')) \times 2. \quad (7)$$

The present invention provides a greater compression effect than that of the background when a value obtained by expression (7) is positive. It is apparent that, depending on the set T', $\#1\_i(T)>>\#1\_i(T')$, with $i<m<j$, $\#1\_m(T)\geq\#1\_m(T')$, and $\#i\_i(T')$ is comparatively small.

Roughly speaking, the compression method of the present invention is adequate for a vector set that satisfies the condition $\#1\_i(T)>>\#i\_i(T)$.

However, since it is expected that this condition can be satisfied with many kinds of vector sets, in consonance with the nature of the numbers that are combined, the scope of the application of the present invention is large.

With i=2 and j=3, the present invention is applied to the following vector set as a practical example, and the number of integers that should be positioned is compared with that for the background.

Dimensions $N=3$ $\#1\_1(T)=325{,}552$ $\#2\_2(T)=22{,}084$ $\#1\_2(T)=7{,}749{,}117$ $\#1\_3(T)=10{,}757{,}793$ The number of integers that are positioned with the background 1 is S1(T)=32,273,379, and the number of integers that are positioned with the background 2 is S2(T)=26,907,131, while the number of integers that are positioned with the present invention is S(T)=12,373,853.

When the transformation function G is so defined that it is $\#2\_2(T')=2$, $\#1\_2(T')=460{,}392$, which is reduced to 5.9% of $\#1\_2(T)$. The increase due to the U information is 44,172, which is less than 1% of the total and can be disregarded.

Therefore, the number of integers that are to be positioned according to the present invention is 38.3% of that of the background 1, and 46.0% of that of the background 2, and data compression can be performed with extremely high efficiency.

(2) A required value can be obtained at high speed by partial data decompression.

According to the data decompression examples, it is apparent that a vector that satisfies a certain condition can be acquired by partial decompression. In the above example 1 for decompressing 20 vectors, the number of integers that are to be decompressed and referred to is twenty: during the decompression of the first components in the T' information, three integers, which are 1, X and 2; during the decompression of the second and the third components of the T' information, seven integers, which are 0, Y, 2, 8, 14, 15 and 17; and during the decompression of the U information, ten integers, which are 0, X, 2, 0, 3, 7, 4, 11, 5 and 16. Since the sum of the integers that have been positioned is 46, a required vector can be obtained by a partial decompression of $20/46=43.5\%$ in this example.

What is claimed is:

1. A method for compressing integer-vector data by using a computer, wherein said integer-vector data are represented as an N-dimensional integer vector set T, comprising the steps of:

converging a distribution of an i-th component value (i is a component number selected from a range wherein i<N) of each vector that belongs to said set T by using a transformation function; and adding information concerning said i-th component to a j-th component (j is a component number selected from a range wherein j>i) in consonance with convergence.

2. The method for compressing integer-vector data according to claim 1, wherein said components of said vectors of said N-dimensional integer vector set T' are arranged in an ascending order in which priority is given to components having smaller numbers, and said set T' is located in a memory area of a computer in a partially decompressible format.

3. The method for decompressing integer-vector data by using a computer wherein said integer-vector data are compressed by the method for compressing integer-vector data according to claim 2, comprising the steps of:

combining an i-th component $v_i$, transformation function $G(v_i)$, and function $A(v_i)$ for each vector of said set T during compression of said integer-vector data in a form of a three-dimensional vector $(G(v_i), v_i, A(v_i))$;

forming a three-dimensional vector set U from which overlapping is removed; and reproducing said N-dimensional integer vector set T by performing a reverse transformation of said N-dimensional integer vector set T' with said three-dimensional vector set U.

4. A method for compressing integer-vector data by using a computer, wherein said integer-vector data are represented as an N-dimensional vector set T, comprising the steps of:

defining a transformation function that satisfies these conditions: (1) all i-th component values (i is a component number selected from a range wherein i<N) of vectors that belong to said set T are included in a domain of said transformation function, (2) said transformation function provides a many-to-one mapping, and (3) said transformation function is an increasing function;

converging a distribution of said i-th component values of said vectors that belong to said set T by using said transformation function; and adding information concerning said i-th components to j-th components (j is a component number selected from a range wherein j>i) in consonance with convergence.

5. The method for compressing integer-vector data according to claim 4, wherein said components of said vectors of said N-dimensional integer vector set T' are arranged in an ascending order in which priority is given to components having smaller numbers, and said set T' is located in a memory area of a computer in a partially decompressible format.

6. The method for decompressing integer-vector data by using a computer wherein said integer-vector data are compressed by the method for compressing integer-vector data according to claim 5, comprising the steps of:

combining an i-th component $v_i$, transformation function $G(v_i)$, and function $A(v_i)$ for each vector of said set T during compression of said integer-vector data in a form of a three-dimensional vector $(G(v_i), v_i, A(v_i))$;

forming a three-dimensional vector set U from which overlapping is removed; and reproducing said N-dimensional integer vector set T by performing a reverse transformation of said N-dimensional integer vector set T' with said three-dimensional vector set U.

7. A method for compressing integer-vector data by using a computer, wherein said integer-vector data are represented as an N-dimensional integer vector set T comprising the steps of:

defining transformation function G that satisfies these conditions: (1) all i-th component values (i is a component number selected from a range wherein i<N) of vectors that belong to said set T are included in a domain of said transformation function, (2) said transformation function provides a many-to-one mapping, and (3) said transformation function is an increasing function;

selecting component number j from a range wherein j>i, while a k-th smallest value of said i-th component values, excluding overlapping values, is defined as [k];

defining transformation function A that satisfies a condition such that when G([k+1])=G([k]), $$A([k+1]) + \min(v_j | v \in T, v_i = [k+1]) > A([k]) + \max(v_j | v \in T, v_i = [k]);$$

performing a transformation by said transformation function G so as to converge a distribution of said i-th component values of vectors that belong to said set T; and adding, to j-th component values of said vectors that belong to said set T, values that are acquired by applying said transformation function A to said i-th components.

8. The method for compressing integer-vector data according to claim 7, wherein said components of said vectors of said N-dimensional integer vector set T' are arranged in an ascending order in which priority is given to components having smaller numbers, and said set T' is located in a memory area of a computer in a partially decompressible format.

9. The method for decompressing integer-vector data by using a computer wherein said integer-vector data are compressed by the method for compressing integer-vector data according to claim 8, comprising the steps of:

combining an i-th component $v_i$, transformation function $G(v_i)$, and function $A(v_i)$ for each vector of said set T during compression of said integer-vector data in a form of a three-dimensional vector $(G(v_i), v_i, A(v_i))$;

forming a three-dimensional vector set U from which overlapping is removed; and reproducing said N-dimensional integer vector set T by performing a reverse transformation of said N-dimensional integer vector set T' with said three-dimensional vector set U.

* * * * *